US008306313B2

United States Patent
Hoogers

(10) Patent No.: US 8,306,313 B2
(45) Date of Patent: Nov. 6, 2012

(54) METHOD FOR PLACING AT LEAST ONE COMPONENT PROVIDED WITH CONNECTION POINTS ON A SUBSTRATE, AS WELL AS SUCH A DEVICE

(75) Inventor: Hubert Francijn Maria Hoogers, Winielre (NL)

(73) Assignee: Assembleon B.V., Veldhoven (NL)

( * ) Notice: Subject to any disclaimer, the term of this patent is extended or adjusted under 35 U.S.C. 154(b) by 918 days.

(21) Appl. No.: 12/167,083

(22) Filed: Jul. 2, 2008

(65) Prior Publication Data

US 2009/0010528 A1 Jan. 8, 2009

(30) Foreign Application Priority Data

Jul. 3, 2007 (NL) .................................... 1034086

(51) Int. Cl.
*G06K 9/00* (2006.01)
(52) U.S. Cl. ...................................... 382/151
(58) Field of Classification Search ............... 382/146, 382/151
See application file for complete search history.

(56) References Cited

U.S. PATENT DOCUMENTS

| 5,113,565 | A | * | 5/1992 | Cipolla et al. | 29/25.01 |
| 6,292,261 | B1 | * | 9/2001 | Fishbaine et al. | 356/623 |
| 6,571,006 | B1 | * | 5/2003 | Montillo et al. | 382/147 |
| 2004/0109172 | A1 | | 6/2004 | Nagao et al. | |

FOREIGN PATENT DOCUMENTS

NL 1031471 C2 3/2007
WO WO 92/14988 A 9/1992

OTHER PUBLICATIONS

International Search Report from NL 1034086.

* cited by examiner

*Primary Examiner* — Tarifur Chowdhury
*Assistant Examiner* — Jonathan Hansen
(74) *Attorney, Agent, or Firm* — Foley & Lardner LLP

(57) ABSTRACT

A method for placing at least one component provided with connection points on a substrate. First, positions of the connection points are determined, after which the component is positioned at desired positions on the substrate with the connection points thereof. Upon placement of a number of components, the contour of a component as well as the positions of the connection points relative to said contour are determined for a first number of components. On the basis of the calculated positions of the connection points relative to the contours average positions of the connection points relative to the contour are calculated. Upon placement of a second number of components the contour of a component is determined, whereupon the expected positions of the connection points relative to the contour are calculated on the basis of said average positions.

13 Claims, 3 Drawing Sheets

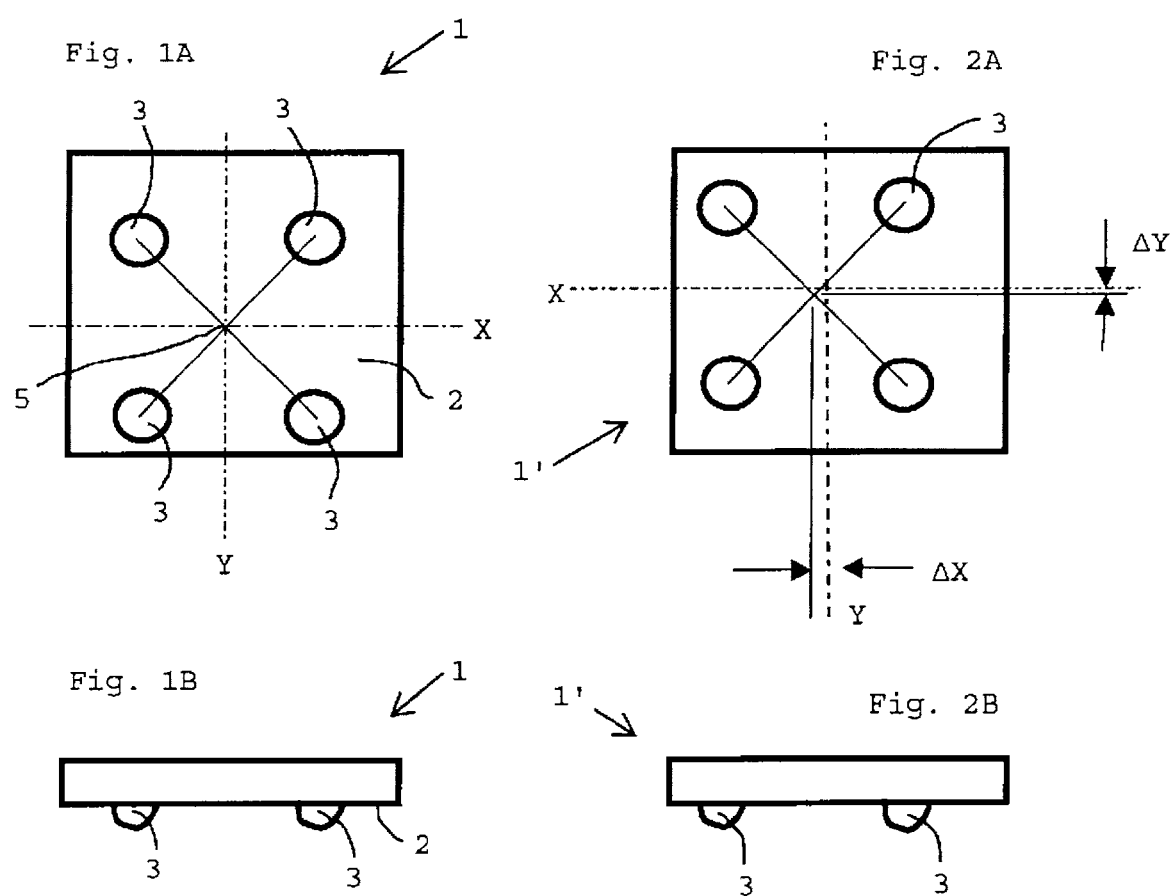

METHOD FOR PLACING AT LEAST ONE COMPONENT PROVIDED WITH CONNECTION POINTS ON A SUBSTRATE, AS WELL AS SUCH A DEVICE

Method for placing at least one component provided with connection points on a substrate, as well as such a device.

The invention relates to a method for placing at least one component provided with connection points on a substrate, wherein positions of the connection points are first determined, after which the component is positioned at desired positions on the substrate with the connection points thereof.

The invention further relates to a device suitable for carrying out such a method.

With such a method, which is known from US-A1-2005/0,018,403, a component is picked up by means of a nozzle and moved to a position above a camera. The component is provided with connection points lying in a plane, which plane faces towards the camera. The nozzle is located on a side remote from the connection points.

The connection points are imaged by means of the camera, after which the positions of the connection points relative to the camera are calculated from the images made. Following that, the component is moved to a position above the substrate, after which the component is placed on the substrate. In doing so, the connection points are positioned at the desired positions on the substrate.

A drawback of this known method is the fact that analysing the image made by means of the camera is a relatively time-consuming process, so that the number of components that can be placed on a substrate within a specific period of time is relatively limited.

The object of the invention is to provide a method which makes it possible to place components provided with connection points on substrates in relatively precise and quick manner.

This object is accomplished with the method according to the invention in that upon placement of a number of components the contour of a component as well as the positions of the connection points relative to said contour are determined for a first number of components, on the basis of which calculated positions of the connection points relative to the contours average positions of the connection points relative to the contour are calculated, after which, upon placement of a second number of components, the contour of a component is determined, whereupon the expected positions of the connection points relative to the contour are calculated on the basis of said average positions.

The determination of a contour of a component can take place much more quickly than the determination of the positions of the connection points of the component. Usually a number of similar components are successively placed on a single substrate or on different substrates in practice. Said components have usually been produced in series, so that the position of the connection points of the components relative to the contour of the component will be the same for all components. Said average positions are determined for the first number components, after which said average positions are subsequently regarded as the positions of the connection points of the second number of components to be placed.

As a result, the positions of the connection points of only a limited number of components need to be determined, after which the positions of the connection points of the other component are calculated. As a result, the rate at which the components can be placed is significantly increased, since the time required for determining a contour of a component is in the order of half a second, for example, whilst the determination of the positions of the connection points often takes up more than one and a half seconds, for example.

One embodiment of the method according to the invention is characterised in that in that an average deviation between the calculated positions and theoretically desired positions of the connection points relative to the contour is determined from the calculated positions of the connection points relative to the contours, whereupon the expected positions of the connection points relative to the contour are determined on the basis of said average deviation.

As already indicated above, series-produced components are used. As a result, all the components from a series will exhibit the same deviation between the actual, calculated positions of the connection points and the theoretically desired positions of the connection points.

The average deviation in the first number of components is regarded as the deviation that will occur in the second number of components to be placed.

As a result, the time required for determining the positions of the connection points is relatively short.

The reason why the components of the series are expected to exhibit the same deviation is that the components are usually produced in a common wafer, after which the wafer is cut or sawn into the individual components. As a deviation between the desired sawing line and the actual sawing line may occur during sawing, all the components of the wafer will exhibit the same deviation between the actual positions and the theoretically desired positions of the connection points.

When components from another wafer are picked up, the average deviation will first have to be determined again.

Another embodiment of the method according to the invention is characterised in that the component is picked up by means of a nozzle, which nozzle is provided with at least one sensor for determining the position of the contour of the component relative to the nozzle, whilst the nozzle is movable with respect to a camera for determining the positions of the connection points.

Providing the nozzle with a sensor makes it possible to determine the contour of the component whilst the nozzle is being moved from a pickup position to the substrate. This leads to an even further reduction of the time required for placing the component. Only when the positions of the connection points on the components are to be determined is the nozzle moved to a position above the camera.

Another embodiment of the method according to the invention is characterised in that the connection points lie in a plane of the component, with the component being rotated with respect to the sensor about an axis of rotation extending transversely to said plane for determining the contour of the component.

Several images of the contour of the component are obtained means of the sensor by rotating the component, from which images the position of the contour relative to the nozzle can be derived.

Yet another embodiment of the method according to the invention is characterised in that the sensor comprises a line array sensor.

Using such a sensor, it is possible to obtain a number of images of the contour of the component in a quick and a simple manner.

Yet another embodiment of the method according to the invention is characterised in that an image of the plane is made by means of the camera in a direction transversely to said plane for determining the positions of the connection points, from which image the positions are determined.

From the image of the plane, the positions of the connection points can be readily determined. When the image is being made, the nozzle can be briefly stopped at a predetermined position. It is also possible, however, to make the image while the nozzle is being moved over the camera, from which image it must also be possible to derive information regarding the contour of the component and/or the position of the nozzle at the moment of making the image.

Yet another embodiment of the method according to the invention is characterised in that the camera comprises a CCD sensor.

The use of such a CCD sensor makes it easy to produce an image of a plane.

The invention is also directed at a device suitable for carrying out such a method, which device is characterised in that the device further comprises at least one sensor for determining the position of a contour of the component relative to the nozzle, means for calculating the average positions of connection points relative to the contour, as well as means for calculating from said average positions the expected positions of connection points of a similar component whose contour has been determined.

When use is made of the calculated positions of the connection points relative to the contour, it is not necessary to determine the positions of the connection points relative to the contour upon placing further components, but the mere determination of the position of the contour or relative to the nozzle will suffice. As a result, placing components provided with connection points on substrates can take place in a precise and quick manner.

The invention will now be explained in more detail with reference to the drawings, in which:

FIGS. 1a and 1b are a bottom view and a side view, respectively, of a component whose connection points are located at theoretically desired positions;

FIGS. 2a and 2b are a bottom view and a side view of a component whose connection points are located at positions different from the theoretically desired positions;

Like parts are indicated by the same numerals in the figures.

Figure 3:
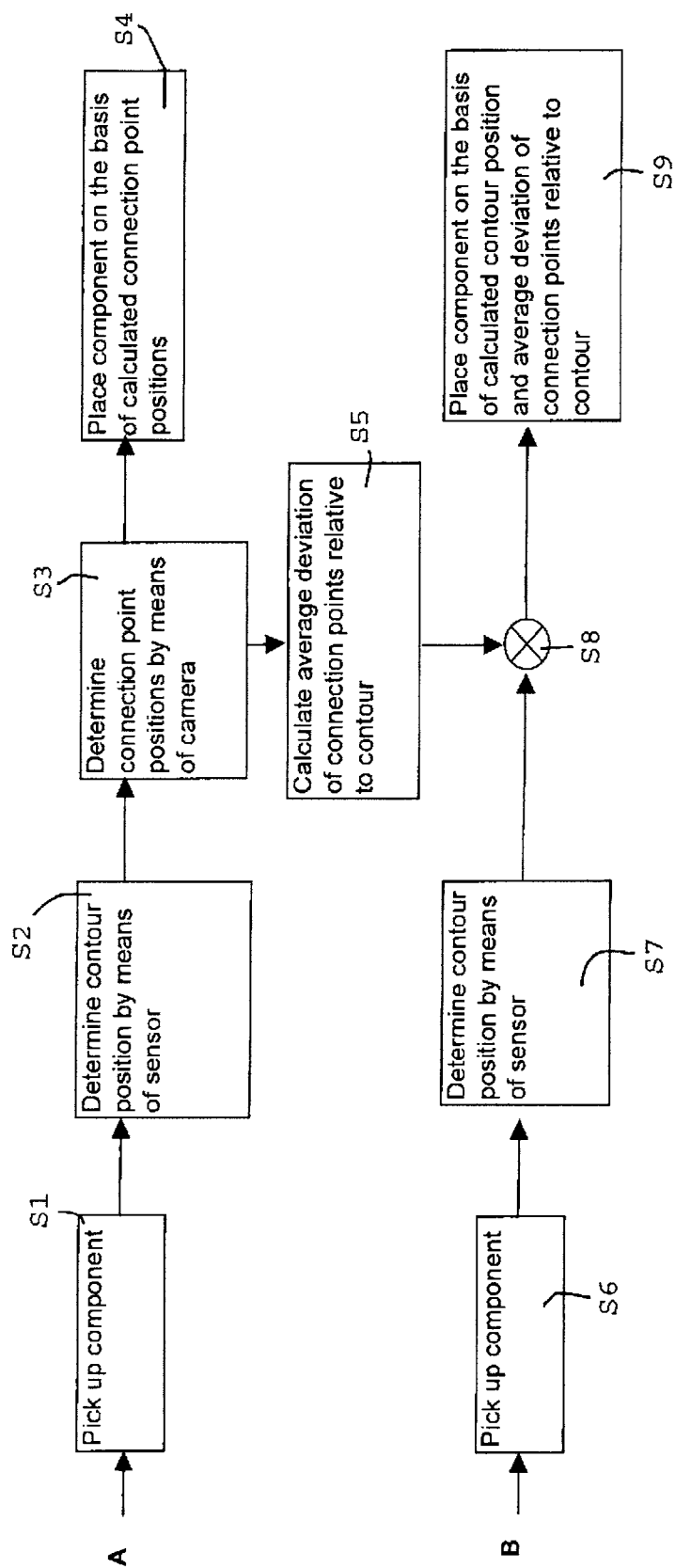
FIG. 3 is a flow diagram of the method according to the invention.

FIGS. 1a and 1b show a bottom view and a side view of a component 1, which is provided at the bottom side 2 with connection points 3 lying in a plane. The connection points 3 are soldering elements, for example, which are arranged in a grid-like pattern on the bottom side 2, as is for example the case with components called BGA (Ball Grid Array). With the component 1 shown in FIG. 1a, the connection points 3 are equally spaced from a central point 5 of an X, Y coordinate system. These positions of the connection points 3 are the theoretically desired positions.

Production faults, for example made while sawing the components 1 from a wafer, may cause the positions of the connection points 3 to exhibit a deviation $\Delta x$ in the x-direction and a deviation $\Delta y$ in the y-direction, as is for example the case with the components 1 shown in FIGS. 2a and 2b.

Components obtained from the same wafer all exhibit comparable deviations $\Delta x$, $\Delta y$.

FIG. 3 shows a flow diagram of the method according to the invention.

When a number of components are to be placed on a number of substrates, which components are from the same production batch, a first number n1 components 1' are first placed on the substrate via procedure A. In step S1 thereof, a component 1' is picked up. Then the position of the contour of the component 1' is determined by means of a sensor (step S2). The contour is the outer circumference of the component 1'. Following that, the positions of the connection points 3 on the components 1' are determined by means of a camera (step S3). Based on the calculated positions of the connection points, the component 1' is subsequently placed at a desired position on the substrate with its connection points 3 (step S4).

Once the positions of the connection points 3 have been determined by means of the camera and the position of the contour has been determined by means of the sensor, the deviations $\Delta x$, $\Delta y$ are calculated. After a number n1 of components 1' have been placed on a substrate or a number of substrates, an average deviation $\Delta x_{av}$ and $\Delta y_{av}$ is calculated.

Procedure B is followed upon placing a next number n2 of components 1', in step S6 of which procedure a component 1' is picked up in the same manner as in step S1. Following that, the position of the contour is determined by means of the sensor (step S7) in a manner corresponding to step S2 of procedure A.

As regards the positions of the connection points 3 it is subsequently assumed that said connection points 3 exhibit the same deviation $\Delta x_{av}$, $\Delta y_{av}$ as the number n1 of components 1' already placed. In step S8 the information regarding the position of the contour and the average deviation $\Delta x_{av}$, $\Delta y_{av}$ of the position of the connection points 3 relative to the contour is combined, whereupon the component 1' is placed at the desired position on the substrate in step S9 on the basis of the calculated position of the contour and the average deviation of the connection points 3 relative to the contour. The time required for procedure B is significantly shorter than the time required for procedure A.

Figure 4:
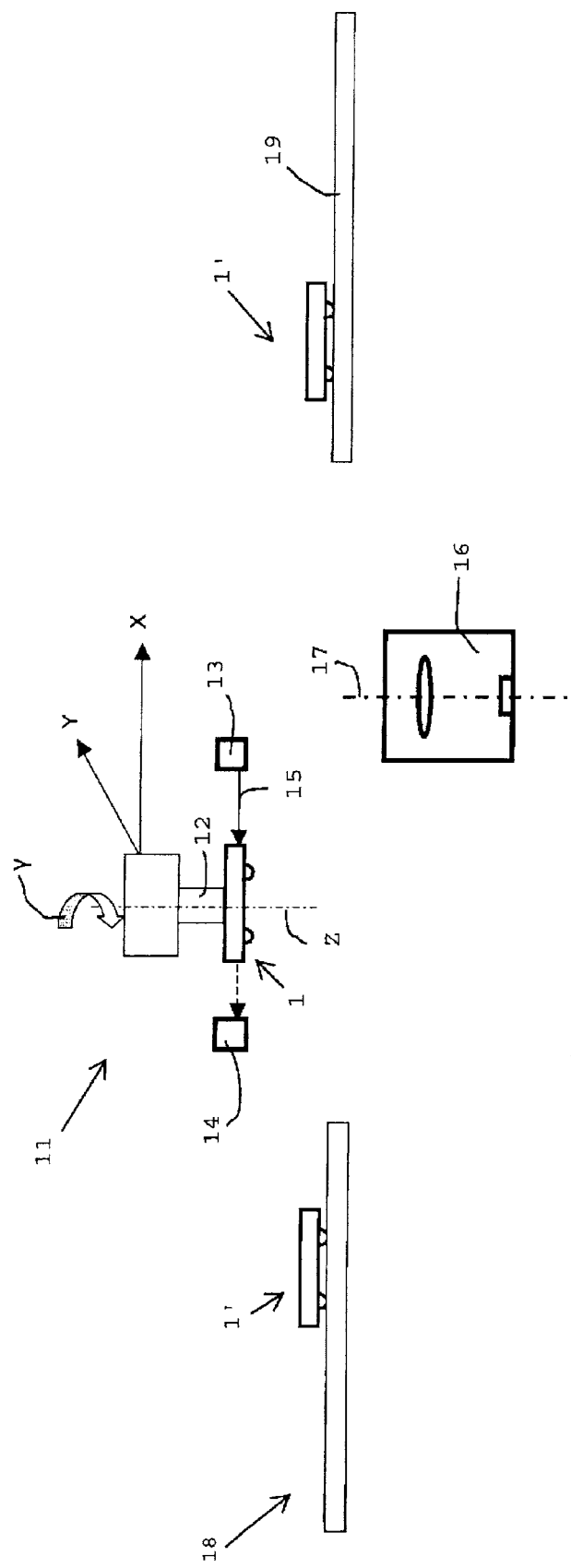
FIG. 4 is a side view of a device according to the invention.

FIG. 4 shows a device 11 according to the invention, which is provided with a nozzle 12 that is movable in the X- and Y-directions, which nozzle 12 is rotatable in the $\Phi$-direction about a Z-axis that extends transversely to the X-axis and the Y-axis. The nozzle 12 is provided with a light source 13 located on one side of the Z-axis and with a sensor 14 located on another side of the Z-axis. An optical path 15 extends between the light source 13 and the sensor 14, transversely to the Z-axis. The image field of the sensor 14 extends parallel to the Z-axis.

The device 11 further comprises a camera 16 having an optical axis 17, which optical axis 17 extends parallel to the Z-axis. The camera 16 has an image field which extends transversely to the optical axis 17 and the Z-axis.

The device further comprises a pickup position 18, where components 1' are presented. The components 1' all have the same orientation in the X- and Y-directions. The device 11 further comprises a substrate support (not shown), on which a substrate 19 (for example a printed circuit board) to be provided with components is present.

Using the nozzle 12, a component 1' is picked up from a pickup position 18 and moved to the substrate 19. During said movement to the substrate 19, the component 1' is rotated in the i-direction, and a number of images of the side of the component 1 are recorded by means of the sensor 14. From said images, the position of the contour of the component 1' relative to the nozzle 12 is determined. Such a method of determining the position of the contour of the component is for example described in the applicant's Dutch patent application No. 1031471, which is incorporated herein by reference. It is possible to make use of images for determining the contour, but it is also possible to make use of shadows formed in the optical path as a result of the light from the light source 13 being blocked by the component 1. It is already known to rotate a component and to determine the orientation of the component on the basis of the shadows.

When procedure A is followed, the nozzle 12 carrying the component 1' is moved over the camera 16, and the positions of the connection points 3 are determined by means of the camera 16. Subsequently, the positions of the connection points 3 relative to the contour of the component 1' are calculated by means of a processor, and deviations $\Delta x$, $\Delta y$ between the actual, calculated positions and the theoretically desired positions are calculated. After the positions of the connection points 3 relative to the nozzle 12 have been calculated, the component 1' can be placed on the substrate 19 by means of the nozzle 12, in such a manner that the connection points 3 will be positioned at the desired positions on the substrate 9.

When procedure B is followed, the nozzle 12 need not be moved over the camera 16, but the component 1 can be placed on the substrate 19 directly after the locations of the positions of the connection points 3 relative to the nozzle 12 have been calculated.

It is also possible to carry out procedure A, i.e. the determination of the average deviation $\Delta x_{av}$ and $\Delta y_{av}$, by means of a device other than the device 11, in which case only the calculated average deviation $\Delta x_{av}$ and $\Delta y_{av}$ is used in the device 11.

It is also possible to determine only the average positions of the connection points relative to the contour in procedure A and to use said average positions in procedure B as the positions of the connection points relative to the contour.

The method is also suitable for calibrating the device 11. The measurement of the component 1 by means of the sensor 14 is verified by means of the camera 17, with the position of the contour relative to the nozzle 12 being determined by means of the sensor 14 as well as the camera 17. Following this, a difference between the position of the component relative to the nozzle according to the sensor 14 and according to the camera 17 is determined. This difference is regarded as the deviation of the sensor 14. This calibration deviation is taken into account in subsequent measurements.

The invention claimed is:

1. A method for placing at least one component provided with connection points on a substrate, comprising:
   determining a contour of each of a first number of components;
   determining positions of the connection points of each of the first number of components;
   placing the first number of components at desired positions on the substrate with the connection points;
   determining positions of the connection points relative to the contour for each of the first number of components, and calculating average positions of the connection points relative to the contour for the first number of components;
   determining a contour of each of a second number of components;
   calculating expected positions of the connection points relative to the contour for each of the second number of components on the basis of said average positions for the first number of components; and
   placing the second number of components at desired positions on the substrate with the connection points.

2. A method according to claim 1, further comprising:
   determining an average deviation between the determined positions and desired positions of the connection points relative to the contour from the determined positions of the connection points relative to the contour; and
   determining the calculated expected positions of the connection points relative to the contour on the basis of said average deviation.

3. A method according to claim 1, further comprising picking up each of the first and second number of components with a nozzle, wherein the nozzle includes a sensor configured to determine a position of the contour of each of the first and second number of components relative to the nozzle and wherein the nozzle is movable with respect to a camera for determining the positions of the connection points.

4. A method according to claim 3, wherein the connection points lie in a plane of each of the first and second number of components, and wherein the method further comprises rotating the first and second number of components with respect to the sensor about an axis of rotation that extends transverse to said plane to determine the contour of each of the first and second number of components.

5. A method according to claim 4, wherein said sensor comprises a line array sensor.

6. A method according to claim 3, further comprising taking an image of a plane with the camera in a direction transverse to said plane to determine the positions of the connection points with the image.

7. A method according to claim 6, wherein the camera comprises a CCD sensor.

8. A device suitable for carrying out the method according to claim 1, comprising:
   a movable nozzle configured to pick up each of the first and second number of components; and
   a camera configured to determine the positions of connection points of each of the first number of components;
   a sensor configured to determine a position of a contour of each of the first and second number of components relative to the nozzle;
   a mechanism configured to calculate the average positions of the connection points of the first number of components relative to the contour; and
   a mechanism configured to calculate the expected positions of connection points of a component of the second number of components whose contour has been determined on the basis of the average positions of the connection points of the first number of components relative to the contour.

9. A device according to claim 8, wherein the nozzle includes the sensor.

10. A device according to claim 8,
    wherein the nozzle is configured to rotate about an axis of rotation,
    wherein an image field of the sensor extends parallel to the axis of rotation, and
    wherein an image field of the camera extends transverse to the axis of rotation.

11. A device according to claim 8, wherein said sensor comprises a line array sensor.

12. A device according to claim 8, wherein said camera comprises a CCD sensor.

13. A method according to claim 1, further comprising obtaining the first and second number of components from the same wafer.

* * * * *